United States Patent
Su et al.

(10) Patent No.: US 8,219,340 B2
(45) Date of Patent: Jul. 10, 2012

(54) MONITORING METHOD FOR THROUGH-SILICON VIAS OF THREE-DIMENSIONAL INTERGRATED CIRCUIT (3D IC) AND APPARATUS USING THE SAME

(75) Inventors: Keng-Li Su, Hsinchu (TW); Chih Sheng Lin, Tainan County (TW); Chih-Wen Hsiao, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 498 days.

(21) Appl. No.: 12/435,311

(22) Filed: May 4, 2009

(65) Prior Publication Data

US 2010/0153043 A1 Jun. 17, 2010

(30) Foreign Application Priority Data

Dec. 17, 2008 (TW) ................................ 97149117 A

(51) Int. Cl.
*G01R 13/00* (2006.01)
*G01R 29/26* (2006.01)

(52) U.S. Cl. ................ 702/71; 702/72; 702/66; 702/81; 702/117; 702/182

(58) Field of Classification Search ................ 702/71, 702/72, 66, 81, 117, 182; 324/72, 765
See application file for complete search history.

(56) References Cited

U.S. PATENT DOCUMENTS

| | | | | |
|---|---|---|---|---|
| 6,784,685 B2* | 8/2004 | Chao et al. | ............... | 324/754.05 |
| 6,937,965 B1* | 8/2005 | Bilak et al. | ............... | 703/2 |
| 7,420,229 B2* | 9/2008 | Schultz et al. | ............... | 257/203 |
| 7,977,962 B2* | 7/2011 | Hargan et al. | ............... | 324/762.01 |
| 2006/0044001 A1* | 3/2006 | Cano et al. | ............... | 324/765 |
| 2007/0001682 A1* | 1/2007 | Habitz et al. | ............... | 324/500 |
| 2007/0145999 A1* | 6/2007 | Cano et al. | ............... | 324/765 |

OTHER PUBLICATIONS

Grochowski et al., "Integrated Circuit Testing for Quality Assurance in Manufacturing: History, Current Status, and Future Trends", Aug. 1997, vol. 44 No. 8, pp. 610-633.*

* cited by examiner

*Primary Examiner* — Eliseo Ramos Feliciano
*Assistant Examiner* — Yaritza H Perez Bermudez

(57) ABSTRACT

A monitoring method for Through-Silicon Vias (TSVs) of a three-dimensional integrated circuit (3D IC) is provided, wherein the 3D IC includes a plurality of TSVs, and the method includes: providing a plurality of inverters; connecting the inverters with the TSVs as a circuit; enabling the circuit to oscillate; measuring an output signal on an output end of one of the inverters; and determining the characteristic of TSVs of the 3D IC based on the output signal.

10 Claims, 11 Drawing Sheets

MONITORING METHOD FOR THROUGH-SILICON VIAS OF THREE-DIMENSIONAL INTERGRATED CIRCUIT (3D IC) AND APPARATUS USING THE SAME

CROSS REFERENCE TO RELATED APPLICATIONS

This Non-provisional application claims priority under 35 U.S.C. 119(a) on Patent Application No(s). 097149117, filed in Taiwan, Republic of China on Dec. 17, 2008, the entire contents of which are hereby incorporated by reference.

BACKGROUND OF THE INVENTION

1. Field of the Invention

The present invention relates to a monitoring method for a three dimensional integrated circuit (3D IC), and in particular relates to a monitoring method for Through Silicon Vias (TSVs) of 3D ICs.

2. Background

As the semiconductor fabrication technology develops, need for smaller electronic devices increases. The type one-chip-per-package which is often applied in traditional IC process.

FIG. 1 shows an outside view diagram of stacked ICs in the prior art. In FIG. 1, the ICs 102 are connected with the lead frame 106 via the leads 104. Taking a metal oxide semiconductor field effect transistor (MOSFET) for example, for deep submicron MOSFETs, RC delay occurs, due to the smaller dimensions of the leads 104; which seriously effects performance of the deep submicron MOSFETs. Thus, three dimensional integrated circuit (3D IC) have been disclosed to reduce RC delay.

FIG. 2A shows an outside view diagram of a 3D IC. The 3D IC 200 comprises a plurality of ICs 202. The ICs 202 are stacked in the 3D space to shorten the total wire length to reduce RC delay. FIG. 2B shows an inside structure diagram of the 3D IC. Within the 3D IC 200, Through-Silicon Vias (TSVs) are disposed throughout, connecting the plurality of ICs 202 therein. Fabrication of TSVs is critical for performance of deep submicron ICs.

For TSV manufacturing, pilot holes of a certain dimension are fabricated on the IC 202 and then filled with a suitable conducting material. However, there is no efficient method to determine whether the TSVs meet manufacturing standards. Therefore, a simple and efficient monitoring method for Through Silicon Vias (TSVs) of 3D ICs is called for.

SUMMARY

Provided is a monitoring method for Through-Silicon Vias (TSVs) of a three-dimensional integrated circuit (3D IC), wherein the 3D IC includes a plurality of TSVs. The monitoring method includes: providing a plurality of inverters; connecting the inverters with the TSVs as a circuit; enabling the circuit to oscillate; measuring an output signal on an output end of one of the inverters; and determining the manufacturing state of TSVs of the 3D IC based on the output signal.

Provided is a monitoring apparatus for Through-Silicon Vias (TSVs) of a three-dimensional integrated circuit (3D IC), wherein the 3D IC includes: a plurality of TSVs, and the monitoring apparatus includes a plurality of inverters, wherein the inverters and the TSVs are connected as a circuit; a signal controller for enabling the circuit to oscillate; and a signal processor for measuring an output signal on an output end of one of the inverters and determining the manufacturing state of TSVs of the 3D IC based on the output signal.

A detailed description is given in the following embodiments with reference to the accompanying drawings.

BRIEF DESCRIPTION OF DRAWINGS

The present invention can be more fully understood by reading the subsequent detailed description and examples with references made to the accompanying drawings, wherein.

DESCRIPTION OF EMBODIMENT

The following description is of the best-contemplated mode of carrying out the invention. This description is made for the purpose of illustrating the general principles of the exemplary embodiment and should not be taken in a limiting sense. The scope of the invention is best determined by reference to the appended claims.

Figure 1:
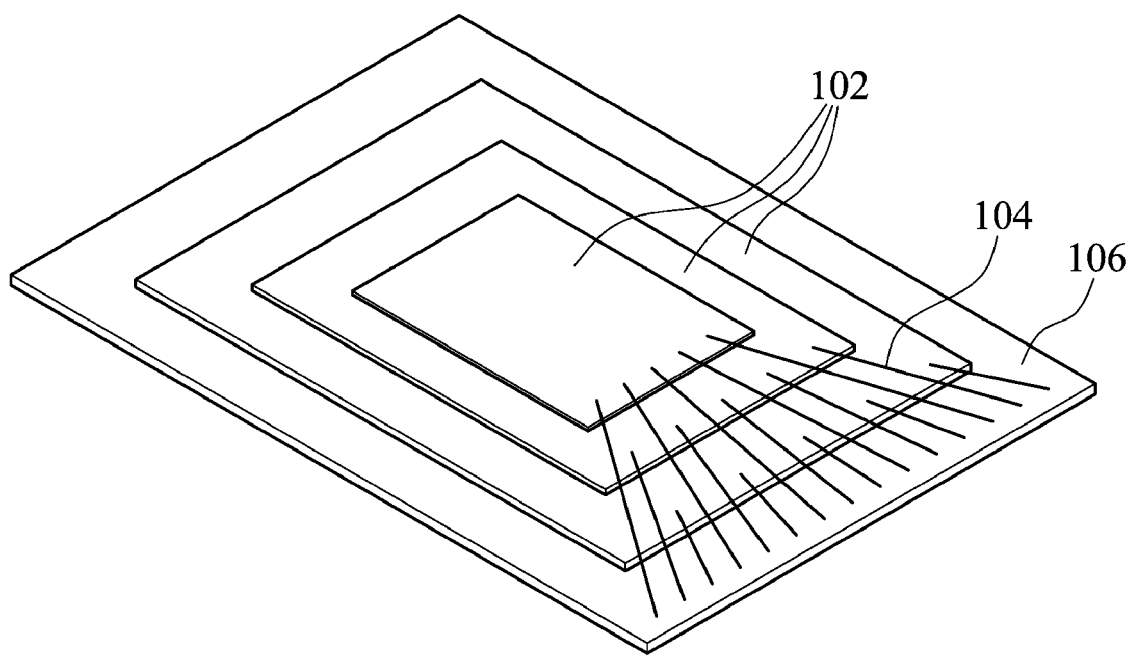
FIG. 1 shows an outside view diagram of stacked ICs in the prior art.
Figure 2A:
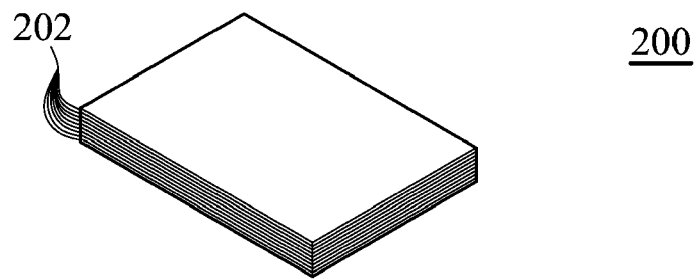
FIG. 2A shows an outside view diagram of a 3D IC.
Figure 2B:
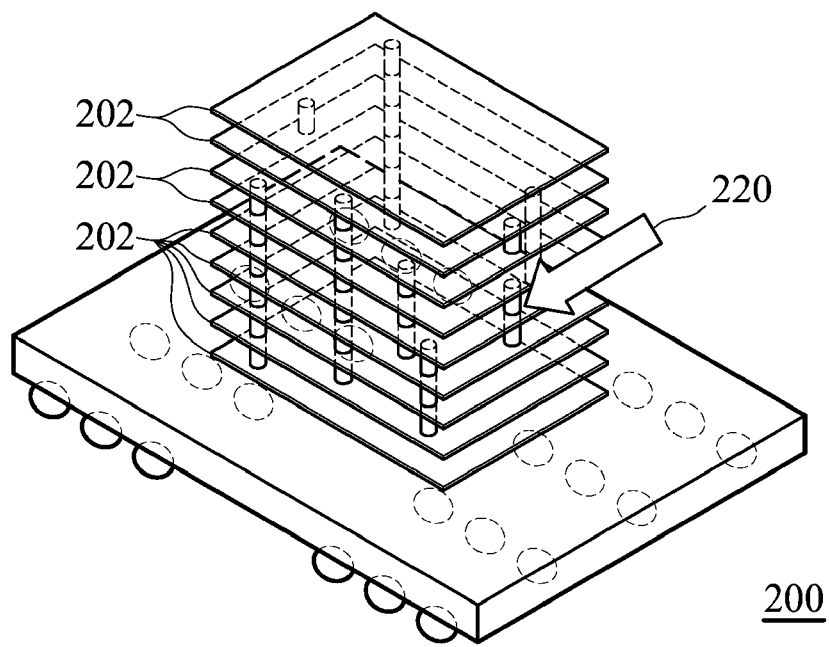
FIG. 2B shows an inside structure diagram of the 3D IC.
Figure 3:
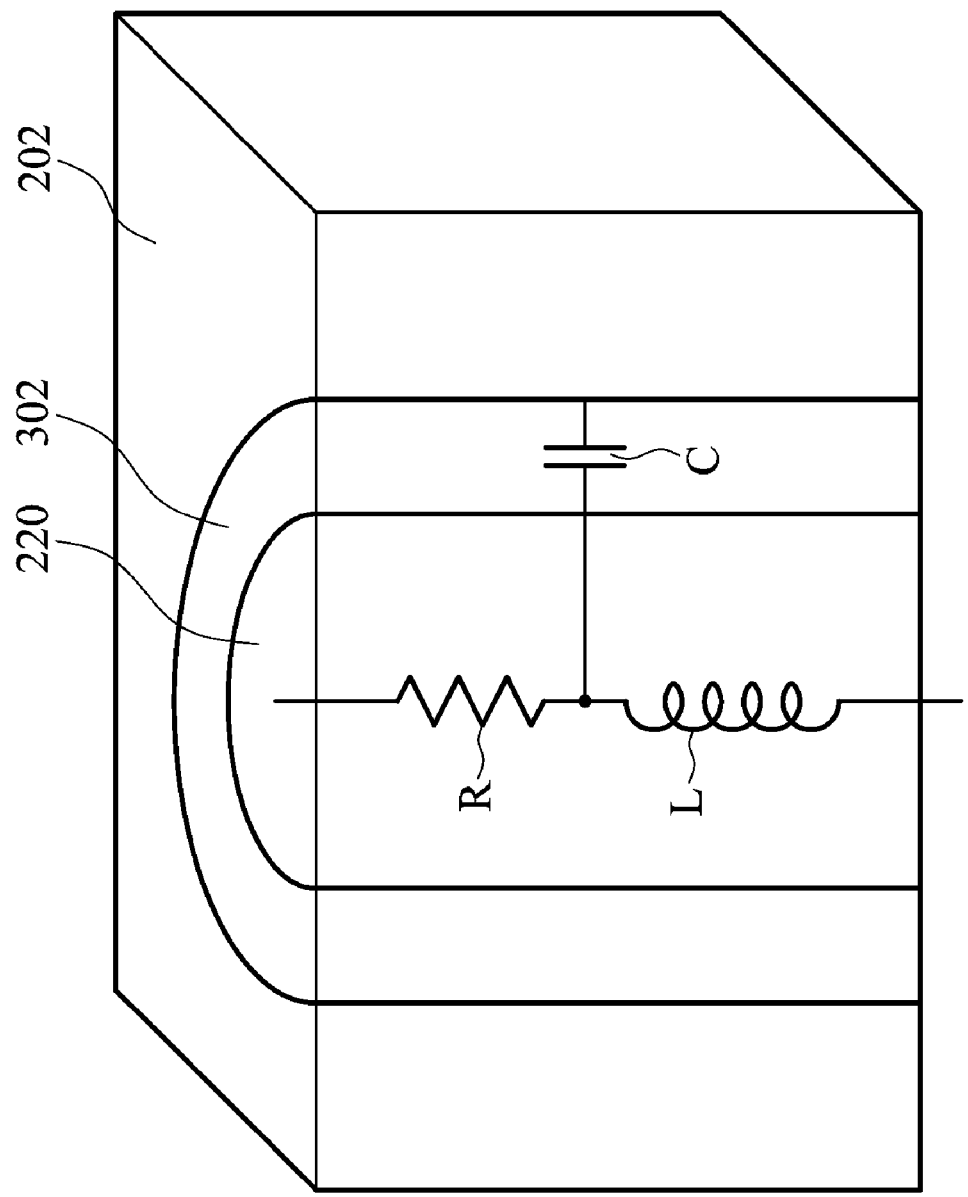
FIG. 3 shows a cross-section diagram of TSVs.

FIG. 3 shows a cross-section diagram of Through-Silicon Vias (TSVs). The present invention is implemented during a Wafer Acceptance Test (WAT) for 3D ICs and is used to inspect the manufacturing state of TSVs 220. Manufacturing of a 3D IC includes, creating pilot holes on the ICs 202, whereby the holes are filled with conductive material to form the TSVs 220, and surrounded with insulating layers 302. The TSVs 220 and insulating layers 302 may be regarded as a RLC equivalent load composed of an equivalent resistor R, an equivalent inductor L and an equivalent capacitor C. Since the TSVs 220 may be made of different material and in different sizes, the RLC equivalent value of the TSVs 220 varies. In addition, when there are defects such as bad TSV fillings, inadequate insulating, or shortcuts between the TSVs and the bulk, due to the manufacturing process, the RLC equivalent value of the TSVs 220 may also vary. Therefore, one of the methods of the invention is to inspect the manufacturing state of the TSVs 220 with an optimum state.

Figure 4:
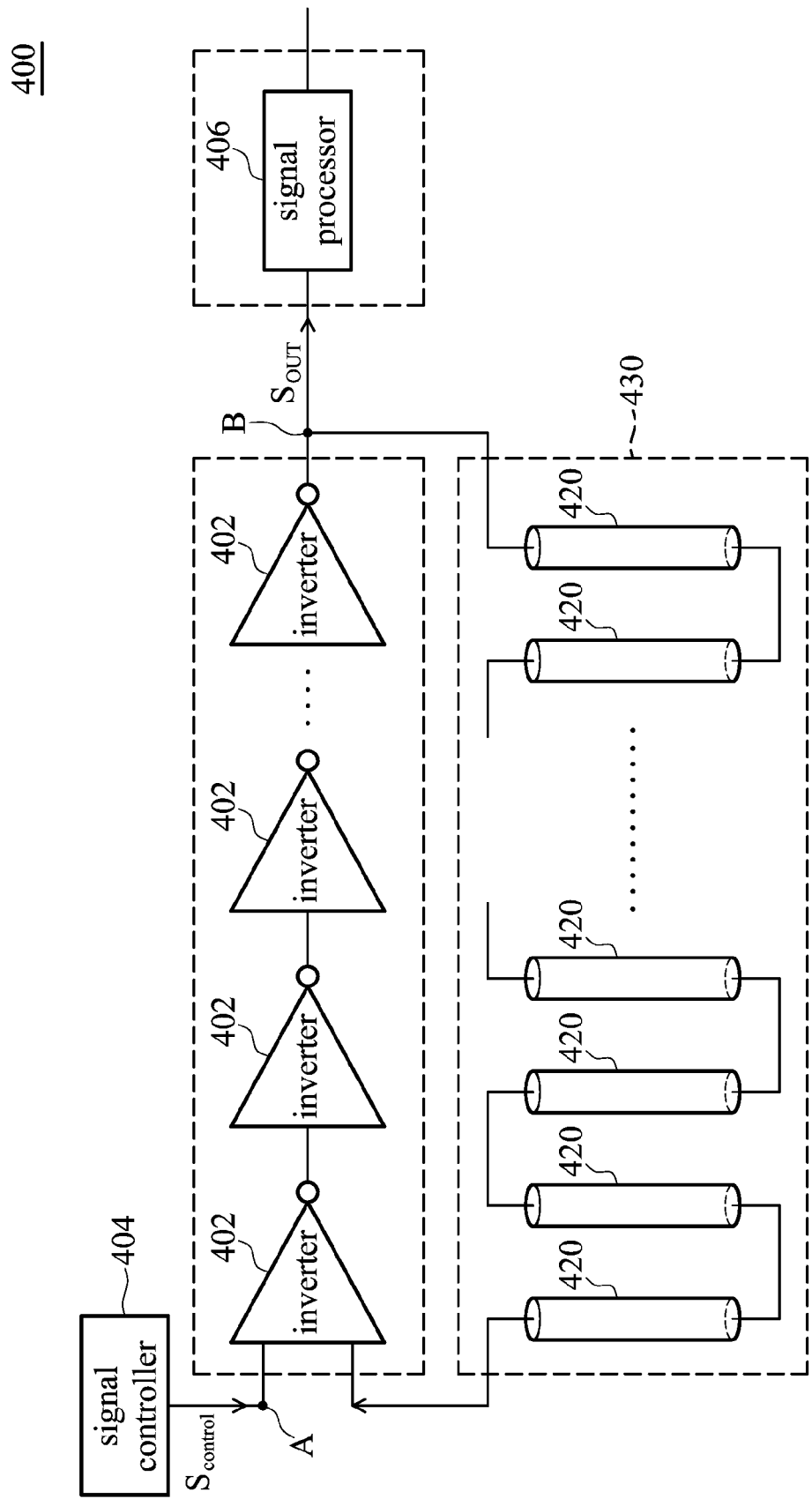
FIG. 4 is a schematic diagram of a monitoring apparatus for the TSV of the 3D IC according to one exemplary embodiment.

FIG. 4 is a schematic diagram of a monitoring apparatus for the TSV of the 3D IC according to one exemplary embodiment. The monitoring apparatus 400 includes a plurality of TSVs 420, a plurality of inverters 402, a signal controller 404 and a signal processor 406, wherein the TSVs 420 and the inverters 402 are connected to be a circuit. One of the connecting methods includes first, connecting all of the TSVs 420 of the 3D IC 430 together. Next, the inverters 402 are connected together and thereafter the circuit is completed. Note that although the inverters 402 are illustrated outside of TSVs 420 in FIG. 4, those skilled in the art may dispose the inverters 402 in each wafer of the 3D IC in the WAT in other embodiments of the invention. In this embodiment, the signal controller 404 imposes a control signal $S_{control}$ onto the circuit, wherein after operation of the inverters 402, the circuit starts to oscillate. Note that the inverters 402 may be (but are not limited to) logic gates such as NAND gates or NOR gates, but the logic gates should be odd-numbered in order to generate oscillatory waves. Moreover, although the control signal $S_{control}$ in FIG. 4 is imposed on the input point A to oscillate the entire circuit, however, the $S_{control}$ may be imposed on any other point in the circuit in other embodiments. When oscillating, an output signal $S_{OUT}$ with oscillatory wave is generated and the frequency thereof may be measured by the signal processor 406 coupled to the output point B. Correspondingly, the monitoring method may be implemented onto an ideally-manufactured 3D IC, which has the same circuit pattern and the same number of TSVs as the tested 3D IC, to obtain another output signal. By comparing the frequencies of the output signals, it is easy to know whether the manufacturing state of TSVs 420 meets a standard or not.

Figure 5:
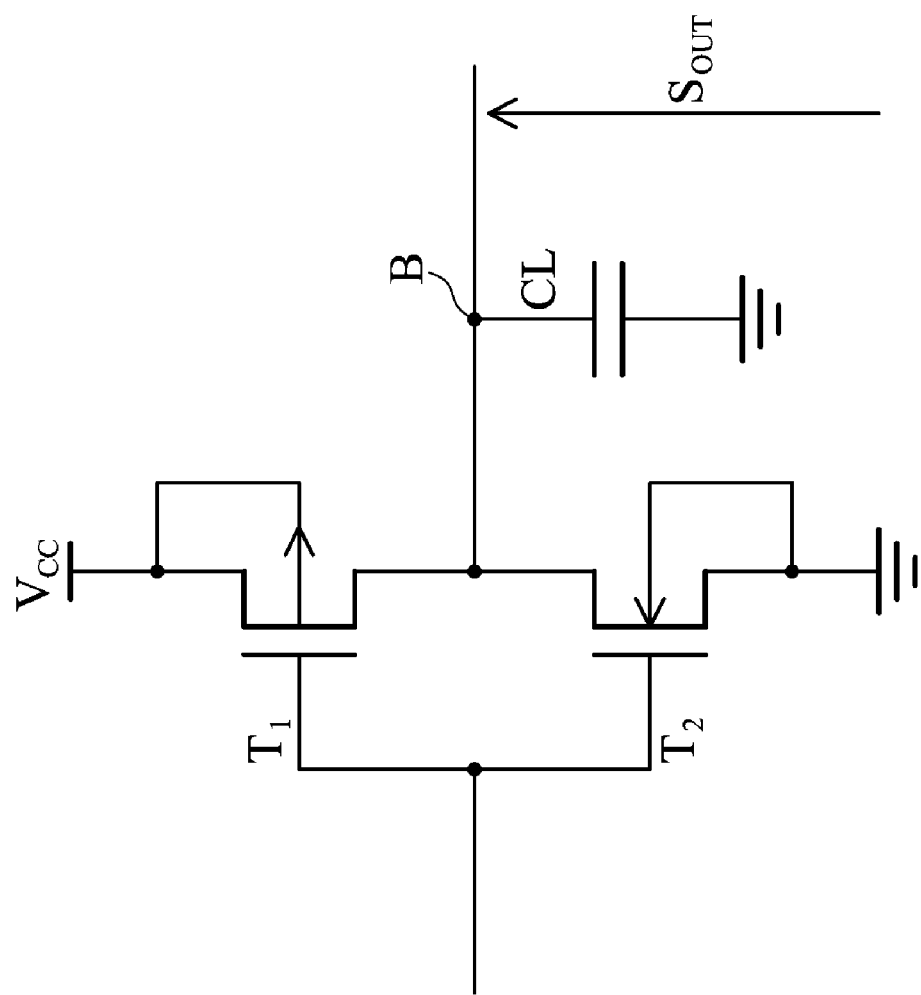
FIG. 5 is a schematic diagram illustrating how an inverter works.

Referring to FIG. 5, the principle of the inverters 402 is discussed below. FIG. 5 is a schematic diagram illustrating how an inverter works (taking the inverter coupled to the output point B in FIG. 4 for example). Each of the inverters 402 is composed of a p-MOSFET T1 and an n-MOSFET T2, and for simplification, a load CL with a source $V_{CC}$. The output signal $S_{OUT}$ is an oscillatory wave with a frequency which is actually determined by a rising delay $td_1$, a falling delay $td_2$ and the number N of the inverters 402, as shown in Formula 1:

$$f = \frac{1}{T} = \frac{1}{N \cdot (td_1 + td_2)}. \quad \text{(Formula 1)}$$

The rising delay $td_1$ and falling delay $td_2$ are further determined by the drive capability of the inverters 402 and the load CL. The load CL is essentially driven by the transistor T1 and the transistor T2. When the transistor T1 drives and charges the load CL to raise the level of the output signal $S_{OUT}$, the rising time constant is the product of the on resistance Rp of the transistor T1 and the load CL. When the transistor T2 drives and discharges the load CL to lower the level of the output signal $S_{OUT}$, the falling time constant is the product of the on resistance Rn of the transistor T2 and the load CL. The frequency of the output signal $S_{OUT}$ in Formula 1 can be calculated according to the following Formula:

$$f = \frac{1}{T} = \frac{1}{N(Rn + Rp) \cdot Cl}. \quad \text{(Formula 2)}$$

Since there is a corresponding relation between the frequency and the load CL, it can be determined whether the TSVs 420 meet a manufacturing standard and further monitor the process of the TSVs by simply comparing the frequency of the circuit having the test TSVs 420 with that of an ideal-manufactured 3D IC.

Figure 6:
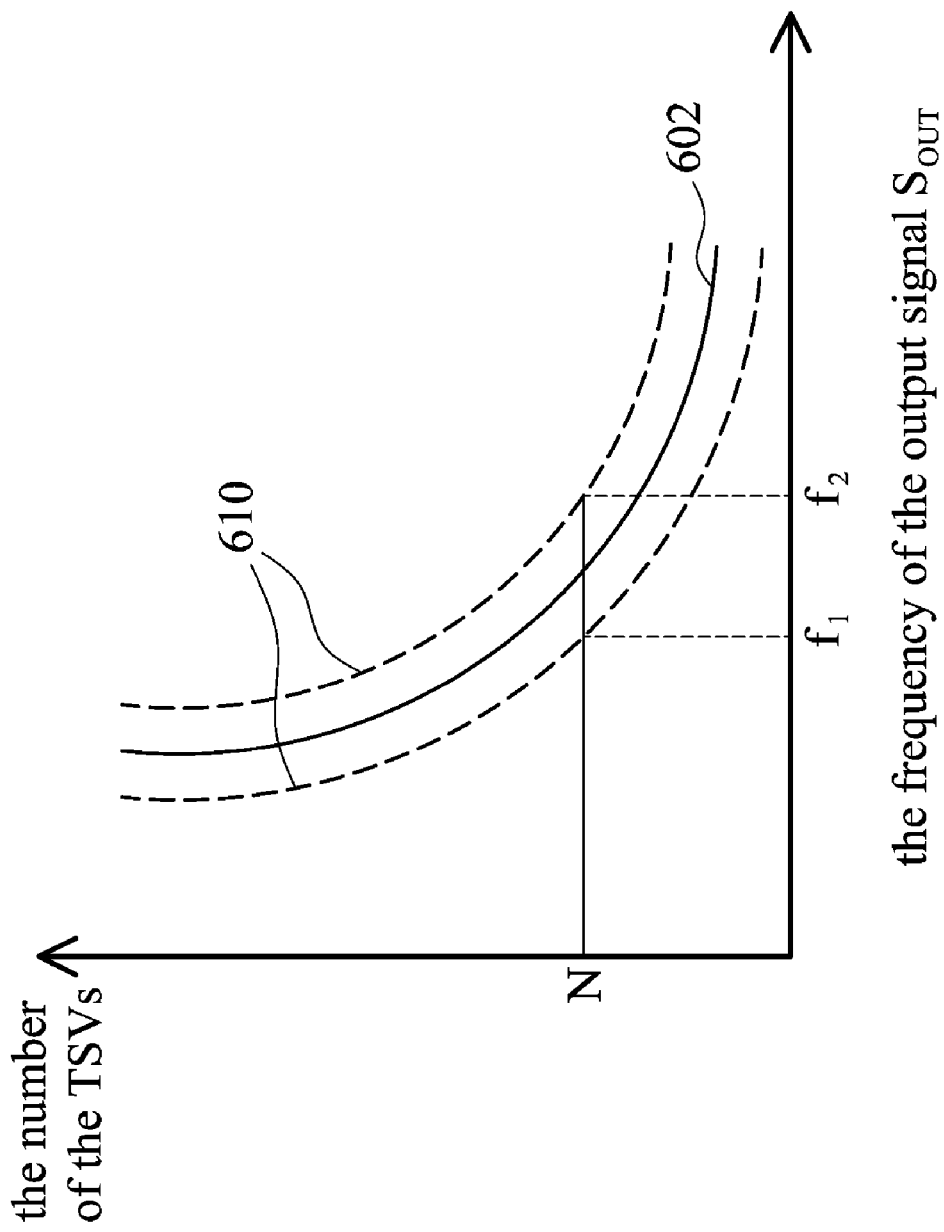
FIG. 6 shows the relationship diagram between the frequency of the output signal and the number of TSVs.

Referring to FIG. 6, the relationship diagram between the frequency of the output signal and the number of TSVs is shown. In a normal condition, when the number of TSVs is changed, the RLC equivalent value thereof will be changed, and so will be the frequency of the output signal output signal SOUT, as shown by the characteristic curve 602. From FIG. 6, it is shown that when the number N of TSVs is reduced, the frequency of the output signal SOUT will be raised. Therefore, if an ideally-manufactured 3D IC and a test 3D IC both have the same circuit pattern and the same number of TSVs and are measured by the same method, their output signals frequencies should be the same. Those skilled in the art may define a reasonable error range 610 for a test 3D IC. For example, when a test 3D IC and the ideally-manufactured 3D IC both have N numbers of TSVs, and the frequency of the output signal SOUT of the 3D IC measured by the present invention falls between frequency f1 and frequency f2, the manufacturing state of the 3D IC meets the required standard. Otherwise, when the frequency of the output signal SOUT of the 3D IC measured by the present invention is lower than the frequency f1 or higher than the frequency f2, the manufacturing state of the 3D IC does not meet the required standard.

Figure 7:
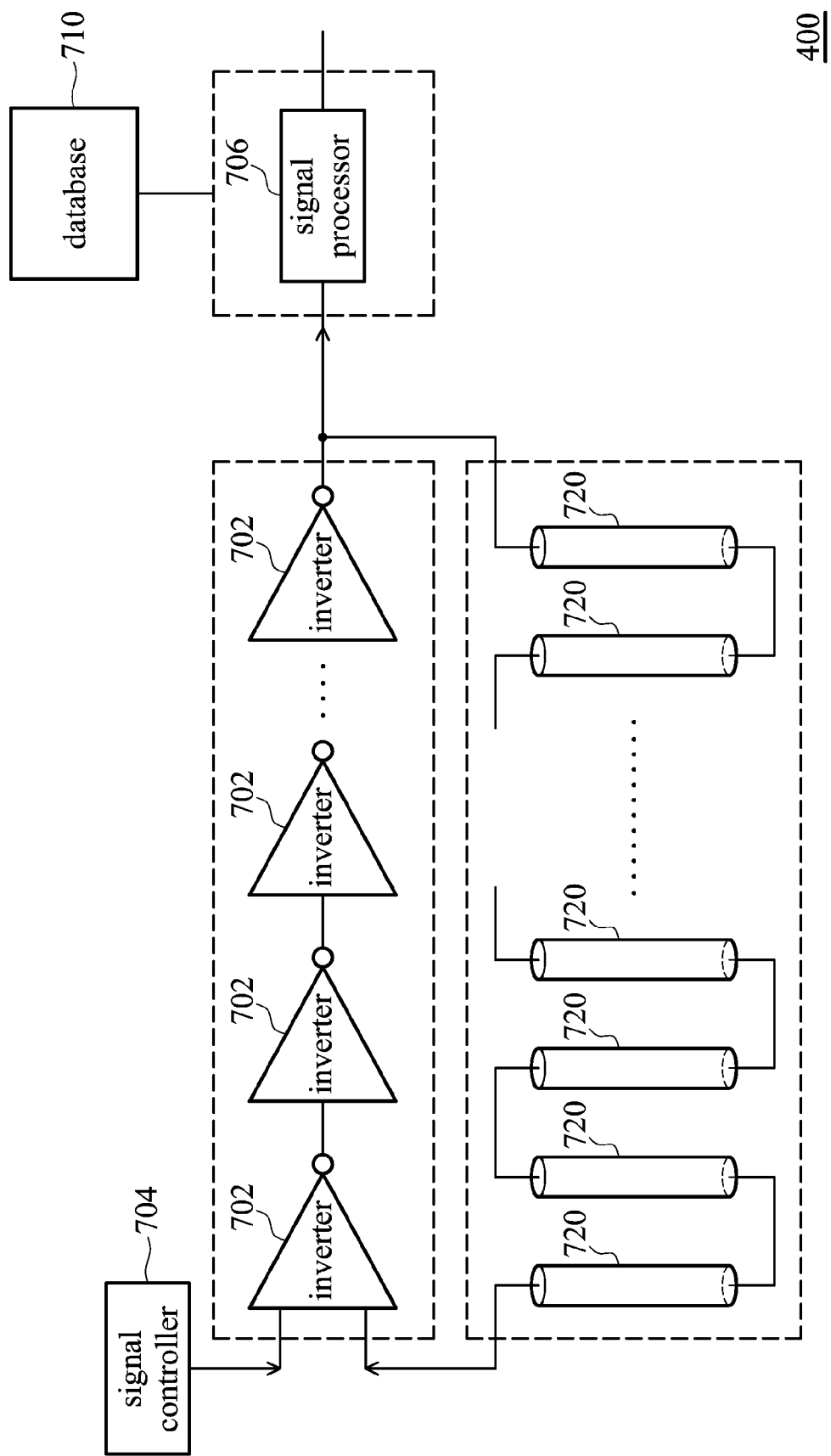
FIG. 7 is a schematic diagram of a monitoring apparatus for the TSV of the 3D IC according to another exemplary embodiments.

FIG. 7 is a schematic diagram of a monitoring apparatus for the TSV of the 3D IC according to another embodiment. In this embodiment, in addition to the TSVs 720, the inverters 702, the signal controller 704 and the signal processor 706 being the same with those in FIG. 4, the monitoring apparatus 400 in FIG. 7 further includes a database 710, wherein the data obtained from the ideally-manufactured 3D IC (having the same circuit pattern and the same number of TSVs as a test 3D IC) according to exemplary embodiment may be stored. For example, the data may include the frequency of the output signal of the ideally-manufactured 3D IC measured by the present invention. The frequency of the ideally-manufactured 3D IC may be regarded as a standard reference frequency, wherein it is easily determined whether the TSVs of the test 3D IC meets the required standard by comparing the frequency of the test 3D IC with the standard reference frequency stored in the database 710.

Figure 8A:
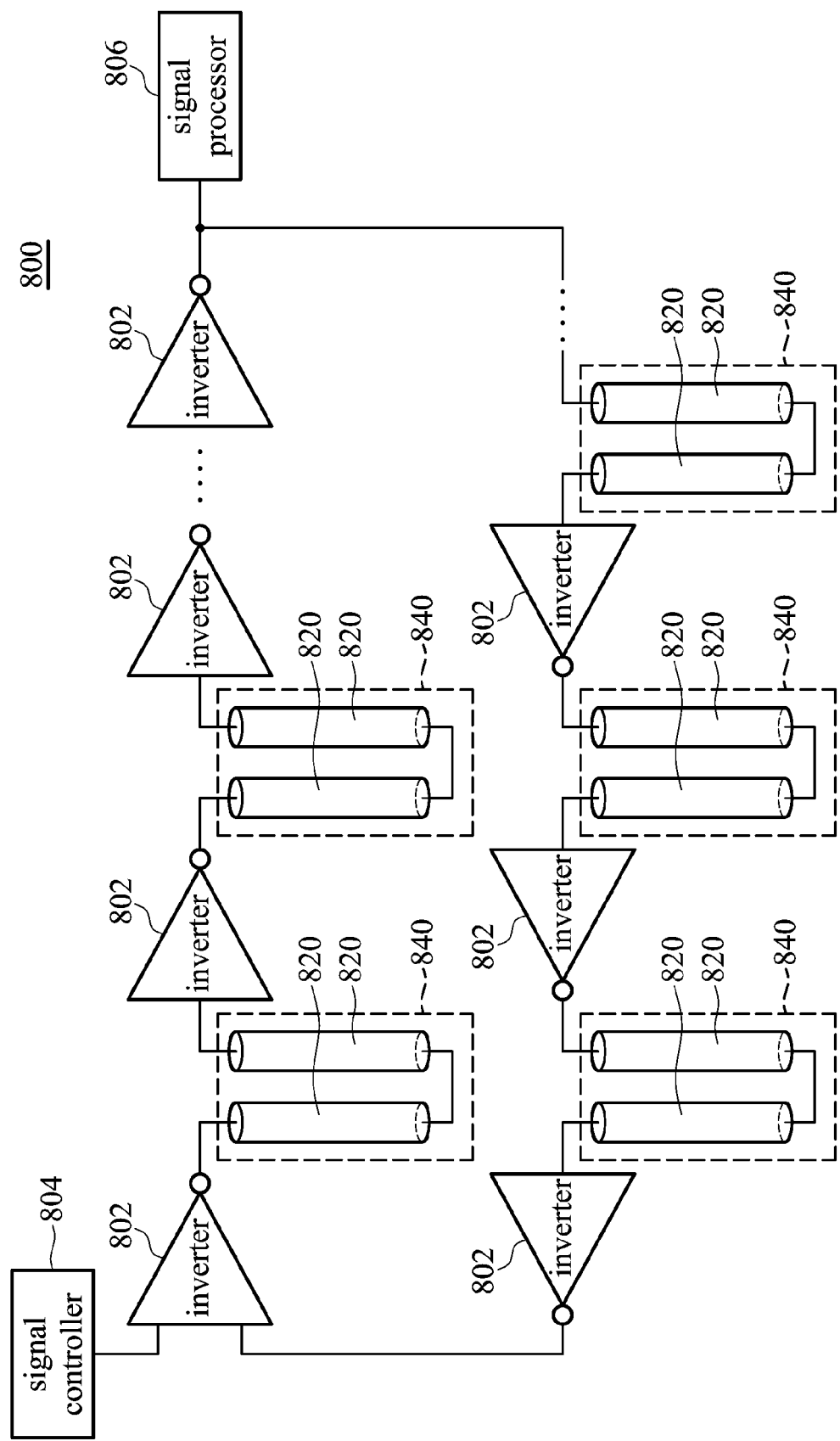
FIG. 8A and FIG. 8B is a schematic diagram of a monitoring apparatus for the TSV of the 3D IC according to the other exemplary embodiments.
Figure 8B:
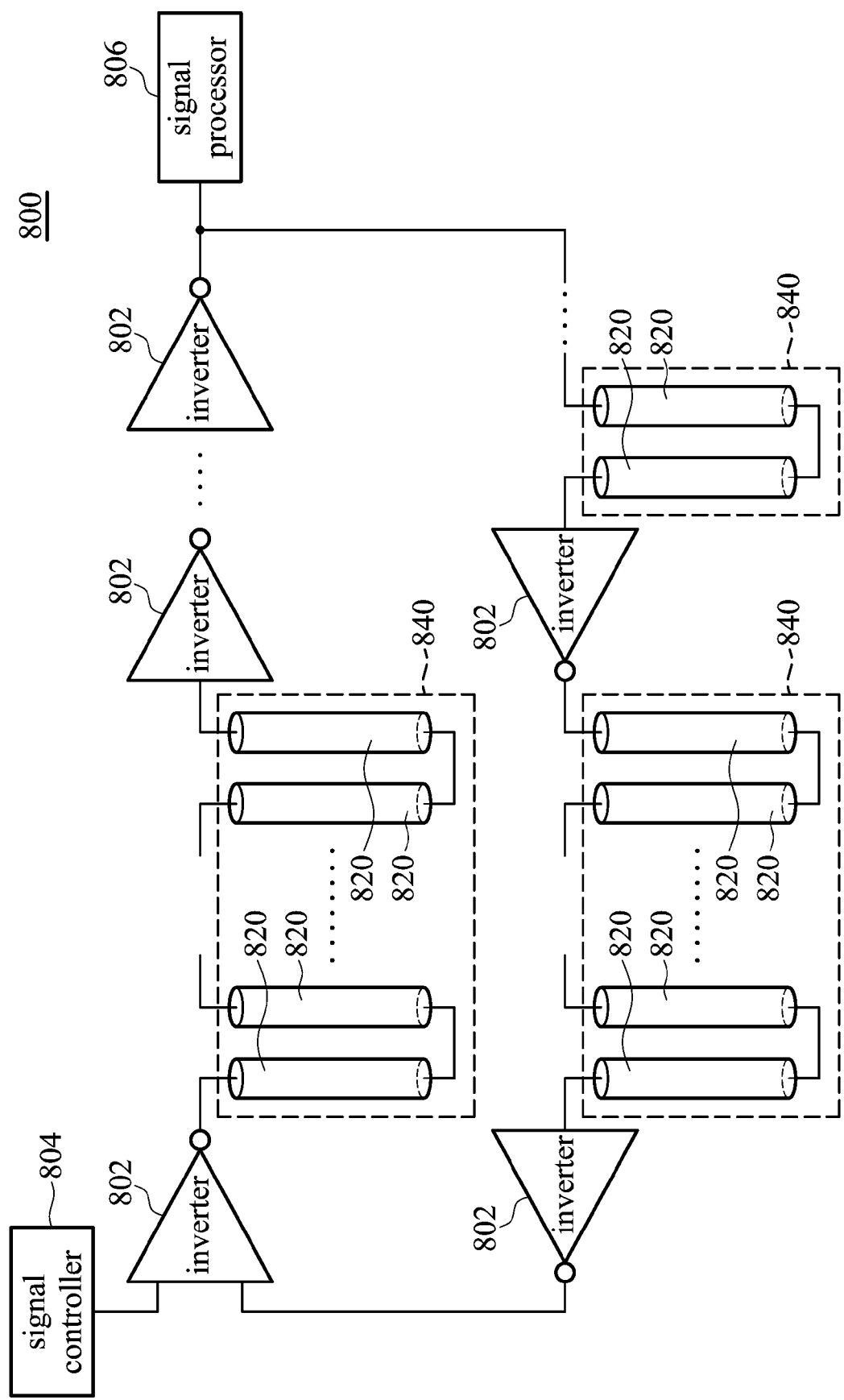

FIG. 8A and FIG. 8B are schematic diagrams of a monitoring apparatus for the TSV of the 3D IC according to the other exemplary embodiment. The TSVs 820, the inverters 802, the signal controller 804 and the signal processor 806 included in the monitoring apparatus 800 are the same as those in FIG. 4, but the connection between the TSVs 820 and the inverters 802 is different. The connection between the TSVs 820 and the inverters 802 in this embodiment comprises: grouping the TSVs 820 into several TSV groups 840, wherein each of the TSV groups 840 comprises at least one TSVs 820 (each of TSV groups 840 may have different number of TSVs); connecting the TSVs 820 of each TSV groups 840 together; connecting each of TSV groups 840 with at least one of the inverters 802; and finally completing all the TSV groups 840 and the inverters 802 as a circuit. Those skilled in the art may select appropriate arrangements according to requirement.

The signal processor 406 or signal processor 806 in FIGS. 4, 8A and 8B have several functions. For example, the signal processor can implement waveform processing for the output signal $S_{OUT}$ to analyze the characteristics of the TSVs in the 3D IC. More specifically, the frequency of the circuit composed of the inverters 402 and the TSVs 420 may be up to about several Giga Herz, in order to make the output signal $S_{OUT}$ easier to be measured, and the signal processor 406 may be lower than the output signal $S_{OUT}$ before measuring.

Figure 9:
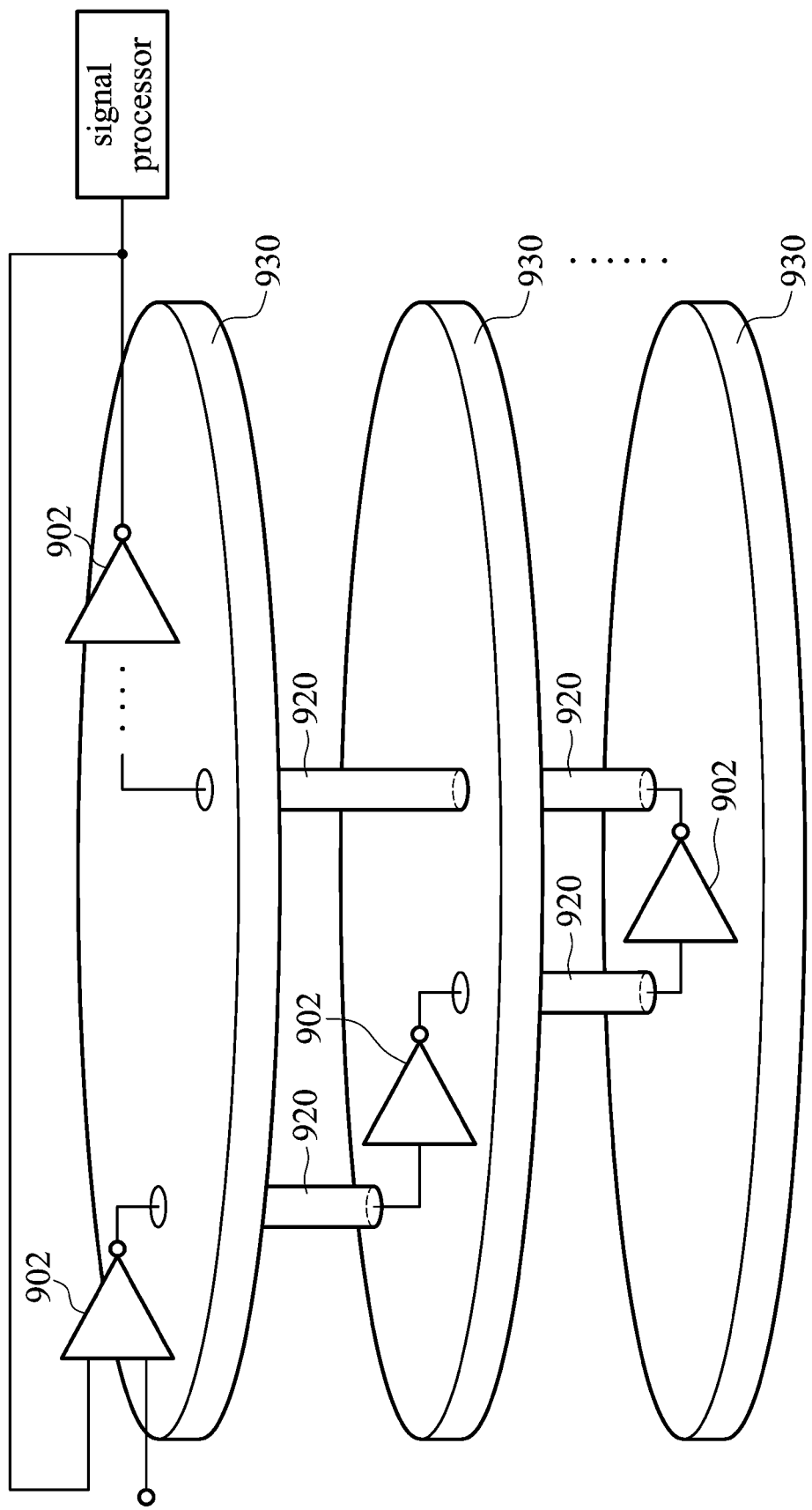
FIG. 9 is a schematic diagram wherein the inverters are disposed in different wafers according to the exemplary embodiment.

FIG. 9 is a diagram of inverters disposed in different wafers according to exemplary embodiment. Instead of disposing the inverters at the outside of the wafer where the TSVs exist, the inverters 902 are disposed in the (different or the same) wafer 930 for measurement, as shown in FIG. 9. Note that if the frequency of the output signal is quite high, it is better to put the inverters and the TSV to be measured on the same wafer to lower the possibility for noise distortions.

Figure 10:
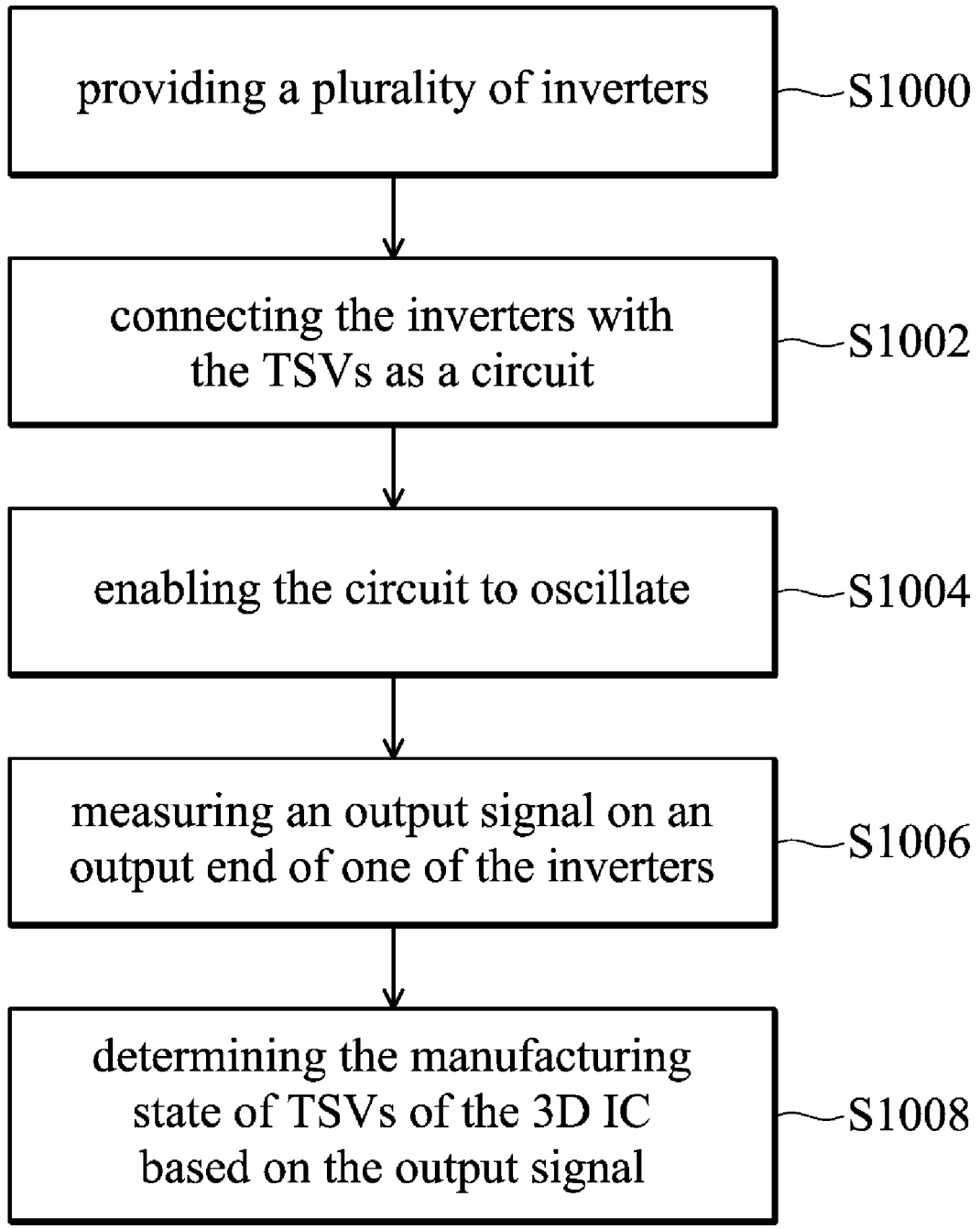
FIG. 10 is a flow chart of the monitoring method for the TSVs of the 3D IC.

The exemplary embodiment further provides a monitoring method for TSVs of a 3D IC. FIG. 10 is a flow chart of the monitoring method for the TSVs of the 3D IC. Referring to FIG. 10 and FIG. 4, the method of the present invention includes: in step S1002, providing a plurality of inverters 402; in step S1004, connecting the inverters 402 with the TSVs 420 to be a circuit, wherein the method of connection is as previously described; in step S1006, enabling the circuit to oscillate; and in step S1008, measuring an output signal $S_{OUT}$ on an output end B of one of the inverters 402 and determining the manufacturing state of the TSVs of the 3D IC based on the output signal. In a preferred embodiment, for example, the step S1008 comprises comparing the output signal of a test 3D IC with that of an ideal-manufactured 3D IC, wherein the ideal-manufactured 3D IC has the same circuit pattern and the same number of TSVs and is measured by the same method.

It is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A monitoring method for Through-Silicon Vias (TSVs) of a three-dimensional integrated circuit (3D IC), wherein the 3D IC includes a plurality of TSVs, comprising:
    providing a plurality of inverters;
    connecting the inverters with the TSVs in series as a circuit loop, wherein connecting the inverters with the TSVs further comprises:
        connecting all of TSVs in series as a TSV group;
        connecting all of the inverters in series as an inverter group; and
        connecting the TSV group with the inverter group in series;
    enabling the circuit loop to oscillate;
    measuring an output signal on an output end of one of the inverters; and
    determining the manufacturing state of the TSVs of the 3D IC based on the output signal.

2. The method as claimed in claim 1, wherein determining the manufacturing state of TSVs of the 3D IC further comprises comparing frequency of the output signal with a reference frequency stored in a database.

3. The method as claimed in claim 2, wherein the reference frequency is obtained from testing a reference 3D IC, and the 3D IC and the reference 3D IC have the same circuit pattern and the same number of TSVs.

4. The method as claimed in claim 1, wherein the inverters are provided to be disposed in the 3D IC.

5. The method as claimed in claim 1, wherein the inverters are provided to be disposed on the outside of the 3D IC.

6. A monitoring apparatus for Through-Silicon Vias (TSVs) of a three-dimensional integrated circuit (3D IC), wherein the 3D IC includes a plurality of TSVs, comprising:
    a plurality of inverters, wherein the inverters and the TSVs are connected in series as a circuit loop, wherein all of the TSVs are connected in series to form a TSV group, all of the inverters are connected in series as an inverter group, and the TSV group is connected with the inverter group in series;
    a signal controller for enabling the circuit loop to oscillate; and
    a signal processor for measuring an output signal on an output end of one of the inverters and determining the manufacturing state of TSVs of the 3D IC based on the output signal.

7. The monitoring apparatus as claimed in claim 6, wherein the signal processor compares frequency of the output signal with a reference frequency stored in a database.

8. The monitoring apparatus as claimed in claim 7 wherein the reference frequency is obtained from testing a reference 3D IC, and the 3D IC and the reference 3D IC have the same circuit pattern and the same number of TSVs.

9. The monitoring apparatus as claimed in claim 6, wherein the inverters are disposed in the 3D IC.

10. The monitoring apparatus as claimed in claim 6, wherein the inverters are disposed on the outside of the 3D IC.

* * * * *